United States Patent
Merz et al.

(10) Patent No.: US 9,679,857 B2
(45) Date of Patent: Jun. 13, 2017

(54) SEMICONDUCTOR DEVICE AND METHOD INCLUDING AN INTERTIAL MASS ELEMENT

(71) Applicants: Matthias Merz, Leuven (BE); Youri Victorovitch Ponomarev, Leuven (BE); Mark van Dal, Heverlee (NL)

(72) Inventors: Matthias Merz, Leuven (BE); Youri Victorovitch Ponomarev, Leuven (BE); Mark van Dal, Heverlee (NL)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 15/266,809

(22) Filed: Sep. 15, 2016

(65) Prior Publication Data

US 2017/0005045 A1    Jan. 5, 2017

Related U.S. Application Data

(62) Division of application No. 12/835,768, filed on Jul. 14, 2010, now abandoned.

(30) Foreign Application Priority Data

Jul. 15, 2009  (EP) .................................... 09165533

(51) Int. Cl.
*H01L 23/52* (2006.01)
*B81C 1/00* (2006.01)
(Continued)

(52) U.S. Cl.
CPC .......... *H01L 23/564* (2013.01); *B81B 7/0006* (2013.01); *B81C 1/00246* (2013.01);
(Continued)

(58) Field of Classification Search
CPC ............ H01L 23/5256; B81C 1/00246; B81C 2203/0714; B81B 7/0006;
(Continued)

(56) References Cited

U.S. PATENT DOCUMENTS 5,907,258 A   5/1999   Chen
7,159,442 B1   1/2007   Jean
(Continued)

FOREIGN PATENT DOCUMENTS

| EP | 1 394 554 A1 | 3/2004 |
| EP | 1 695 937 A2 | 8/2006 |
| WO | 03/069355 A1 | 8/2003 |

OTHER PUBLICATIONS

Extended European Search Report for European Patent Appln. No. 09165533.2 (Feb. 18, 2010).
(Continued)

*Primary Examiner* — Eduardo A Rodela
*Assistant Examiner* — Christopher M Roland (57) ABSTRACT

Disclosed is a semiconductor device comprising a stack of patterned metal layers separated by dielectric layers, the stack comprising a first conductive support structure and a second conductive support structure and a cavity in which an inertial mass element comprising at least one metal portion is conductively coupled to the first support structure and the second support structure by respective conductive connection portions, at least one of said conductive connection portions being designed to break upon the inertial mass element being exposed to an acceleration force exceeding a threshold defined by the dimensions of the conductive connection portions. A method of manufacturing such a semiconductor device is also disclosed.

11 Claims, 6 Drawing Sheets

(51) Int. Cl.
  *B81B 7/02* (2006.01)
  *G01P 15/06* (2006.01)
  *H01L 23/00* (2006.01)
  *B81C 99/00* (2010.01)
  *B81B 7/00* (2006.01)
  *H01L 21/768* (2006.01)
  *H01L 23/522* (2006.01)
  *H01L 23/525* (2006.01)
  *H01L 23/528* (2006.01)
  *G01P 15/08* (2006.01)

(52) U.S. Cl.
  CPC ............ *B81C 99/005* (2013.01); *G01P 15/06* (2013.01); *G01P 15/0802* (2013.01); *H01L 21/768* (2013.01); *H01L 23/528* (2013.01); *H01L 23/5226* (2013.01); *H01L 23/5256* (2013.01); *B81B 2201/0235* (2013.01); *B81B 2203/0315* (2013.01); *B81B 2207/015* (2013.01); *B81C 2201/013* (2013.01); *B81C 2203/0136* (2013.01); *B81C 2203/0714* (2013.01); *G01P 2015/0862* (2013.01); *G01P 2015/0877* (2013.01)

(58) Field of Classification Search
  CPC ............. B81B 2201/0235; G01P 15/06; G01P 15/0802; G01P 2015/0862; G01P 2015/0877
  See application file for complete search history.

(56) References Cited

U.S. PATENT DOCUMENTS

| | | |
|---|---|---|
| 2004/0121504 A1 | 6/2004 | Zabini |
| 2005/0252308 A1 | 11/2005 | Hjelt |
| 2006/0105543 A1 | 5/2006 | Xiao et al. |
| 2006/0205106 A1 | 9/2006 | Fukuda |
| 2008/0202258 A1 | 8/2008 | Armin |
| 2012/0112294 A1* | 5/2012 | Van Dal ................ B81B 7/0012 257/417 |

OTHER PUBLICATIONS

"Complete Environmental Monitoring: UltraShock," MadgeTech Inc., pp. 1-9, (Jul. 2007).

* cited by examiner

SEMICONDUCTOR DEVICE AND METHOD INCLUDING AN INTERTIAL MASS ELEMENT

CROSS-REFERENCE TO RELATED APPLICATIONS

This application claims priority as a divisional of U.S. application Ser. No. 12/835,768 filed on Jul. 14, 2010, which claims the priority under 35 U.S.C. §119 of European patent application no. 09165533.2, filed on Jul. 15, 2009, the contents of which are incorporated by reference herein.

FIELD OF INVENTION

The present invention relates to a semiconductor device comprising a stack of patterned metal layers separated by dielectric layers.

The present invention further relates to a method of manufacturing such a semiconductor device.

BACKGROUND OF THE INVENTION

Nowadays, semiconductor devices such as integrated circuits (ICs) routinely comprise patterned metallization layers for interconnecting circuit elements, e.g. transistor terminals in the substrate or to provide external access, e.g. bond pads, to the circuit elements that are embedded in the semiconductor device. Typically, the metallization layers are formed by stacking and patterning dielectric layers and metal layers to obtain the required interconnections. The dielectric and metal layers themselves may contain sub-layers. The dielectric layers typically comprise vias to conductively connect metal portions in the different metal layers with each other.

Typically, significant efforts are made to ensure that defective semiconductor devices are removed from a batch of manufactured semiconductor devices to avoid field returns of such devices as much as possible. Field returns inconvenience the customer, and can lead to a loss of business because of the customer losing faith in the product. Nevertheless, it is very difficult to capture all defective semiconductor devices such that it cannot be avoided that some defective devices enter the market. On the other hand, a returned faulty device may have entered the market functioning correctly, where it is possible that the fault has developed through misuse of the semiconductor device, e.g. by the customer exposing the device to excessive mechanical impacts. Obviously, in such a case, the manufacturer cannot be held responsible for the failure of the device.

It is difficult to establish why a semiconductor device returned from the field has failed. Re-engineering the device to determine the cause of failure is not always successful and is cost-prohibitive for single devices. It is possible to embed a micro-electromechanical sensor (MEMS) device in the metallization stack of the semiconductor device to monitor the acceleration forces to which the device has been subjected with such forces exceeding certain threshold values being indicative of the device having been subjected to sudden impacts. This approach has the drawback that active monitoring of the MEMS sensor is required during the lifetime of the semiconductor device, which adds to the energy consumption of the device as well as to its cost because some memory element and logic circuitry must be provided for continuous sensor read out and to store the maximum acceleration force to which the MEMS device has been exposed.

SUMMARY OF THE INVENTION

The present invention seeks to provide a semiconductor device for which exposure to mechanical shocks can be more easily detected.

The present invention further seeks to provide a method of manufacturing such a semiconductor device.

According to a first aspect of the present invention, there is provided a semiconductor device comprising a stack of patterned metal layers separated by dielectric layers, said stack comprising a first conductive support structure and a second conductive support structure; and a cavity in which an inertial mass element comprising at least one metal portion is conductively coupled to the first support structure and the second support structure by respective conductive connection portions, at least one of said conductive connection portions being designed to break upon the inertial mass element being exposed to an acceleration force exceeding a threshold defined by the dimensions of the conductive connection portions.

Hence, the present invention provides a mechanical fuse-type shock sensor where the fuse element is formed by at least one of the connection portions that connect the inertial mass element to the conductive support structures. Due to the fact that the inertial mass element is surrounded by a cavity, the acceleration forces experienced by the inertial mass element cause the formation of counter force on the connection portions. At least one of the connection portions may be dimensioned such that the counter portion material loses its structural integrity, i.e. breaks, upon this counter force exceeding a certain value. Hence, the dimensioning of the connection portions may be used to set the acceleration force value at which the connection portion breaks. This has the advantage that no permanent monitoring of the sensor is required. Since the inertial mass element and the connection portions define a conductive path between the first and second conductive support structures, upon return of the device it may simply be established if this conductive path is still intact, e.g. by measuring the resistance of this path.

The first and second conductive support structures may be externally accessible, e.g. connected to contact pads or pins of the electronic device in order to establish if this conductive path is still intact. Alternatively, the electronic device may further comprise a detector for detecting a disruption in said conductive coupling. This has advantage that the pin count of the semiconductor device may be reduced.

In an embodiment, the respective conductive connection portions are metal portions from the same metal layer as the metal portion of the inertial mass element, wherein at least one of the respective conductive connection portions has a reduced width and/or thickness compared to the metal portion of the inertial mass element. In case of the conductive portion(s) having a reduced thickness, this may be established by selectively exposing the appropriate portion(s) to a selective etching step. A reduced width has the advantage that no additional processing steps are required because this may be achieved by the provision of an appropriate metal patterning mask.

In a further embodiment, the inertial mass element comprises a plurality of perforations extending through the inertial mass element. This has the advantage that the formation of the cavity can be better controlled because at least part of the etchant for forming the cavity can penetrate the stack through these perforations.

Advantageously, one of the metal layers of the stack below the inertial mass element further comprises a first further metal portion extending from the first to the second conductive support structure and a second further metal portion extending from the second to the first conductive support structure, said first and second further metal portions being separated from each other by a gap preventing said further metal portions becoming conductively connected, said first and second further metal portions defining an etch barrier for preventing the formation of said cavity extending beyond said further metal portions. This prevents the cavity from extending into the stack too deeply, thus protecting the structural integrity of the stack in general and the first and second conductive support structures in particular.

It is also advantageous if the stack further comprises a perforated metal portion extending over the inertial mass element and at least partially extending over the first and second conductive support structures. The presence of such a perforated metal portion allows capping of the shock sensor cavity, e.g. by deposition of SiN, SiO2 or another metal layer. The advantage of using a perforated metal portion rather than a perforated passivation layer is that the perforations in the metal typically can be kept smaller, such that these perforations are rapidly sealed by the sealant, thus reducing the amount of sealant contaminating the cavity.

In an embodiment, the inertial mass element comprises a stack of metal layer portions separated by dielectric layer portions, each of said dielectric layer portions comprising a plurality of vias for conductively interconnecting the metal layer portions. This increases the weight of the inertial mass element, such that the fracturing of the conductive connection portions can be more easily achieved.

The metal portion of the inertial mass element may be coupled to respective metal portions of the first and second conductive support structures, said respective metal portions belonging to a different metal layer of the stack than the metal portion of the inertial mass element, and wherein each of the respective conductive connection portions comprises at least one via. In this embodiment, the support structures are vertically displaced compared to the metal portion of the inertial mass element to which the vias are connected. This overcomes a potential problem with shock sensors in which the support structures are laterally displaced with respect to the inertial mass element, where elastically deformable conductive connection portions can deform to such an extent that the inertial mass element is displaced such that it becomes supported by the cavity wall, in which case the conductive connection portions may fracture at an inaccurate force or may not fracture at all.

In an embodiment, the inertial mass element is sandwiched between the metal portion of the first conductive support structure and the metal portion of the second conductive support structure. This shock sensor is particularly suitable for detecting acceleration forces having a substantial lateral (horizontal) component.

In an alternative embodiment, the inertial mass element is suspended from the respective metal portions of the first and second conductive support structures by the respective conductive connection portions. This shock sensor is particularly suitable for detecting acceleration forces having a substantial longitudinal (vertical) component.

The inertial mass element may extend in a lateral direction, and wherein the respective conductive connection portions are connected to the same lateral end portion of the inertial mass element such that the inertial mass element acts as a lever. This has the advantage that smaller forces are required to fracture at least one of the conductive coupling elements.

In an embodiment, one of said conductive connection portions is a metal portion and the other of said conductive connections portions comprises at least one via. This has the advantage that the shock sensor is sensitive to acceleration forces in both the lateral and the vertical direction.

Advantageously, the stack comprises a plurality of cavities each comprising an inertial mass element conductively coupled to a first support structure and a second support structure by respective conductive connection portions, wherein at least one of the conductive connection portions in each cavity is designed to break upon the inertial mass element being exposed to an acceleration force exceeding a threshold that is unique to that cavity. This has the advantage that the acceleration force to which the electronic device has been subjected can be more accurately determined.

According to another aspect of the present invention, there is provided a method of manufacturing a semiconductor device, comprising forming a stack of patterned metal layers separated by dielectric layers, said stack comprising a first conductive support structure and a second conductive support structure and an inertial mass element comprising at least one metal portion conductively coupled to the first support structure and the second support structure by respective conductive connection portions, at least one of said conductive connection portions being designed to break upon the inertial mass element being exposed to an acceleration force exceeding a threshold defined by the dimensions of the conductive connection portions; forming a passivation layer over said stack; selectively removing the passivation layer over the area comprising the inertial mass element; and etching the exposed area to form a cavity around the inertial mass element. This method has the advantage that it can easily be realized in existing semiconductor manufacturing processes, in particular CMOS processes. Preferably, said stack comprises a perforated metal portion extending over the inertial mass element and at least partially extending over the first and second conductive support structures, wherein said etching step is performed through said perforations. As previously explained, this facilitates the deposition of a capping layer to seal the cavity without significantly contaminating the cavity in the sealing step.

BRIEF DESCRIPTION OF THE EMBODIMENTS

Embodiments of the invention are described in more detail and by way of non-limiting examples with reference to the accompanying drawings, wherein FIG. 1 schematically depicts an example embodiment of the method of the present invention.

DETAILED DESCRIPTION OF THE DRAWINGS

It should be understood that the Figures are merely schematic and are not drawn to scale. It should also be understood that the same reference numerals are used throughout the Figures to indicate the same or similar parts. In the following detailed description, the principles of the present invention will be explained in further detail using complementary metal oxide silicon (CMOS) devices and processes. CMOS has been chosen because it is the most commonly used semiconductor technology. It is pointed out that this choice has been made by way of non-limiting example only and that the present invention may be applied in any suitable semiconductor technology, e.g. silicon-on-insulator and SiGe technologies.

Figure 1:
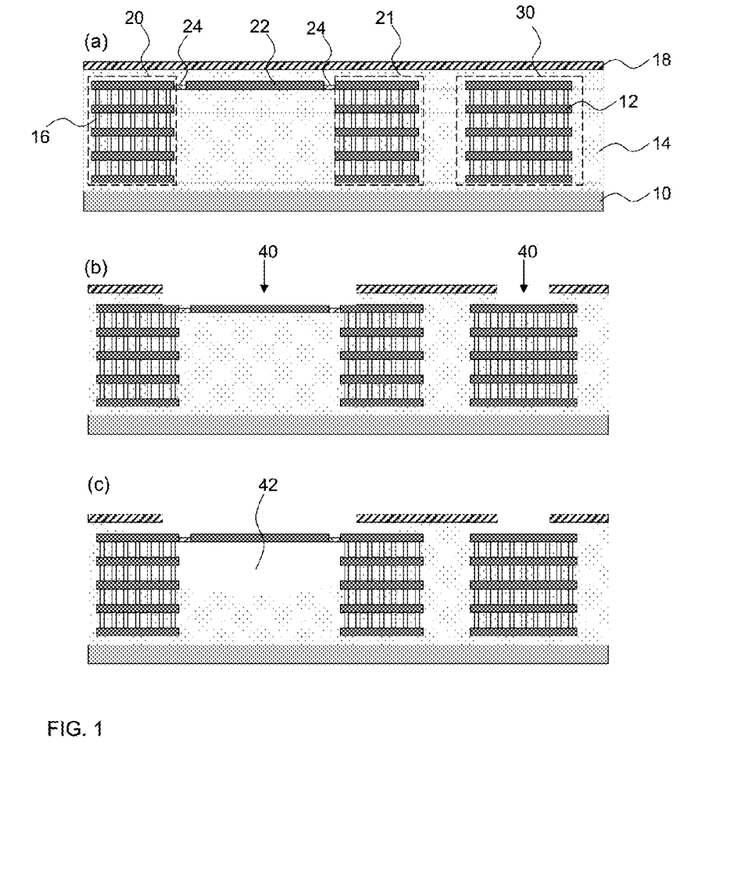

FIG. 1 depicts the main steps for a CMOS compatible manufacturing process of an electronic device comprising a fuse-like passive shock sensor. As shown in step (a), on a substrate 10, a stack of patterned metal layers 12 separated by dielectric layers 14 is provided. In FIG. 1, an electronic device having five metal layers is shown by way of non-limiting example only. The device may have any suitable number of metal layers. The dielectric layers 14 in between the metal layers 12 comprise vias 16 for conductively connecting vertically displaced metal layer portions. Such via-comprising dielectric layers 14 will also be referred to as via layers. Further via layers, e.g. between the bottom metal layer 12 and the substrate 10 may also be provided.

Each metal layer 12 and each dielectric layer 14 is depicted as a single layer in FIG. 1 for the sake of clarity only. It should be appreciated that such layers may consist of a number of stacked sub-layers, for instance in a CMOS 14 process, stacks of Ti, TiN, AlCu, TiN may be used to define a single metal layer in the metallization stack. Similarly, it will be apparent that the vias 16 may be formed from more than a single material. For instance, in the aforementioned CMOS 14 technology, a via 16 may be formed by a TiN liner and a W plug. Other semiconductor processes may use different materials, e.g. Cu for the metal layers 12 and vias 16.

Each of the dielectric layers 14 may also comprise more than a single layer. For instance, such a dielectric layer may be a stack comprising FSG (fluorosilicate glass), $SiO_2$ and HDP oxide (High Density Plasma) any other suitable dielectric material combination. Other suitable materials may also be used. In step (a), a cross-section of a partially processed semiconductor device structure is shown in which the deposition of the metallization stack has been completed. This has not been explained in further detail for reasons of brevity because this structure may be obtained using existing processing steps. The metallization stack typically comprises a plurality of interconnect structures for interconnecting circuit elements, e.g. transistor terminals, in the substrate 10 or for connecting such circuit elements to external contacts, e.g. bond pads or pins, of the semiconductor device, e.g. chip.

The shown cross-section comprises structures for a shock sensor on the left and a conventional bond pad 30 on the right. The entire die is capped by layers of oxide and nitride, the so-called passivation stack 18 or scratch protection, which protects the chip from external influences such as humidity or mechanical damage, e.g. scratches. The shock sensor is implemented as an inertial mass element 22 suspended by conductive connecting portions 24, which are connected to support structures 20 and 21 in FIG. 1 (comprising all of the metal layers 12 and the via layers 14 of the metallization stack). It is emphasized that this is shown by way of non-limiting example only; it should be understood that the support structures 20 and 21 may be formed using only selected layers of the metallization stack as will be explained in more detail later. In FIG. 1, the inertial mass element 22 is formed as a patterned metal portion of the metallization stack. The conductive connection portions 24 will have an elastic modulus defined by the materials chosen to form these portions, which in FIG. 1 are typically formed as part of the metal layer 12 to which they belong. Because of this elastic modulus, the conductive connection portions 24 act as springs when the inertial mass element 22 is suspended in air, as will be explained in more detail below.

In FIG. 1, the conductive connection portions 24 are recessed with respect to the surrounding metal layer. This may be achieved by subjecting these portions to an additional etching step during the formation of the metallization stack. For instance, in case of multi-layered conductive connection portions 24, the metal stack of the portions can be reduced, e.g. etching away the top TiN and AlCu metal layer, leaving only a Ti/TiN stack. An advantage of this approach is that such a thin stack breaks more easily compared to a metal stack having its full thickness, thus allowing a reduction of the size of the inertial mass to achieve the same detection characteristics, i.e. the detection of the same acceleration force threshold being exceeded, which translates to a reduction in overall sensor size and cost.

Alternatively, the conductive connection portions 24 may consist of relatively narrow lines involving the same metal stack as the inertial mass element 22. In this embodiment, the entire shock sensor can be fully realized using conventional metallization stack processing followed by one additional process step.

In order to create a void or cavity around the inertial mass element 22, the passivation layer 18 is removed from over the inertial mass element 22 by means of a conventional passivation etch, e.g. a bond pad opening etch as shown in step (b). Openings 40 are shown over the inertial mass element 22 and the bond pad 30 by way of non-limiting example only.

The only step required in addition to conventional back end processing steps is the step in which the inertial mass element 22 is released from the surrounding dielectric 14 (in steps (b) and (c), the dielectric layers 14 are shown as a single structure for reasons of clarity only), which for instance may be implemented by means of an isotropic wet etch or HF (hydrofluoric acid) vapor etch for example. This is shown in step (c), in which the etching step has resulted in the inertial mass element 22 being suspended in a cavity 42. It is important that the etchant removes the dielectric materials but does not attack the conductive structures including inertial mass element 22 and the conductive connection portions 24 such that a 'free floating' inertial mass element 22 is obtained.

As shown in FIG. 1(*c*), the dielectric etching step can result in an under etch of the support structures 20, 21 to which the conductive connection portions 24 are connected. This however is not a cause for concern because these structures 20, 21 are stabilized by the lower via layers 16 and metal layers 12. The under etch at bond pads 30 should not be critical for the same reason. However, in order to avoid potential problems with the structural integrity of the bond pads 30, the bond pad openings 40 may be protected using an additional mask (not shown) during the release etch of the inertial mass element 22.

The principle of the fuse-like shock sensor of the present invention is now explained in more detail. The conductive connection portions 24 of the shock sensor are dimensioned to break at a critical force $F_c$ exerted by the inertial mass element 22 having a mass m. In accordance with Newton's laws, F=m·a, such that the critical force Fc=F when acceleration a reaches the critical value. Depending on the material properties the conductive connection portions 24, the dimensions of these elements, e.g. thickness, width, number of conductive connection portions 24, mass of the inertial mass element 22 and so on, may be chosen by design to predefine the critical value of the acceleration according to the following formula for defining the fracture force of a single beam:

$$Fx=S*W*H^2/(6*L)$$

Wherein L is the beam length, W is the beam width, H is the beam height and S fracture strength. From F=m·a, the critical acceleration a at which n beams having a combined mass M fracture may be expressed as follows:

$$a=n*S*W*H^2/(6*L*m)$$

Since the acceleration to which the inertial mass element 22 is subjected is directly related to an impact force, e.g. shock, the dimensions of the conductive connection portions 24 may be chosen such that the inertial mass element is (partially) released by breaking at least one of the conductive connection portions 24 when the acceleration has reached a value that is indicative of the electronic device having been subjected to an impact expected to damage the device.

The conductive connection portions 24 and the inertial mass element 22 define a conductive path between the first conductive support structure 20 and the second conductive support structure 21. In order to detect whether this conductive path is still intact, the electronic device may further comprise a detection circuit (not shown) connected to the first conductive support structure 20 and the second conductive support structure 21 for measuring the conductivity or resistance of the conductive path. Since such a detection circuit may be implemented by the skilled person using routine skill, this circuit will not be further explained for reasons of brevity only.

In an embodiment, the detection circuit is coupled to a test arrangement such as a IEEE 1149.1 or IEEE 1500 compliant test access port, which allows investigation of the shock sensor by re-using test facilities that are already present in the electronic device. This for instance may reduce the pin count of the electronic device. Alternatively, the detection circuit may be connected to dedicated bond pads for external access. Alternatively, the detection circuit may be connected to a wireless transceiver for allowing wireless access to the detection circuit. In yet another embodiment, the first conductive support structure 20 and the second conductive support structure 21 are connected to dedicated bond pads such that the detection circuit may be external to the electronic device. Other suitable detection arrangements will be apparent to the skilled person.

Figure 2:
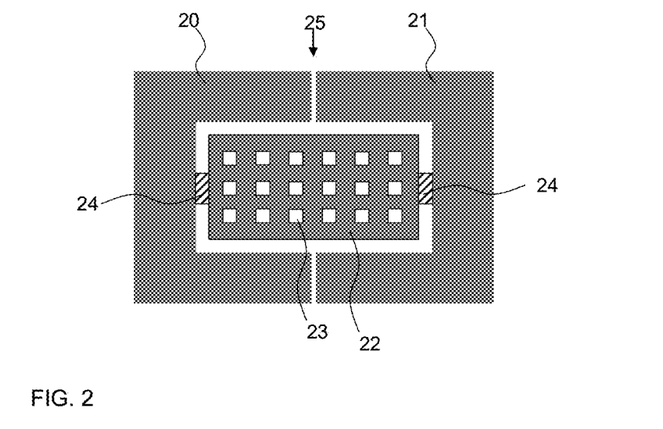
FIG. 2 schematically depicts an aspect of an electronic device in accordance with an embodiment of the present invention.

FIG. 2 schematically depicts a top view of the shock sensor of FIG. 1, in which the inertial mass elements 22 is fixed to the conductive connection portions 24, which are attached to the first conductive support structure 20 and the second conductive support structure 21. Perforations 23, which may be defined in the mask used for etching the inertial mass element 22, are present in the inertial mass element 22 to facilitate the release of the inertial mass element 22 from the surrounding dielectric 14. The perforations 23 provide better access to the dielectric layers 14 underneath the inertial mass element 22 during the etching step of FIG. 1(c), thereby allowing a reduction of the duration of this etching step, which reduces the under etching of the first conductive support structure 20 and the second conductive support structure 21, thereby improving the structural integrity of these support elements.

Figure 3:
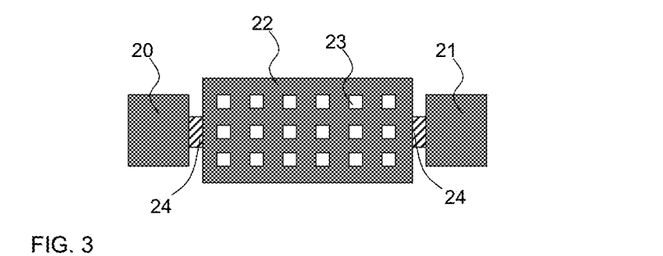
FIG. 3 schematically depicts an aspect of an electronic device in accordance with another embodiment of the present invention.

In FIG. 2, the support frame formed by the first conductive support structure 20 and the second conductive support structure 21 almost fully encloses the inertial mass element 22, thus reducing lateral etch in the release etching step and restricting the size of the cavity 42 to the area of the shock sensor. The frame must be interrupted as indicated by gap 25 such that it does not form a conductive path in parallel with the conductive path formed by the conductive connection portions 24 and the inertial mass element 22. Otherwise the fracture of at least one of the conductive connection portions 24 cannot be detected by electrical measurements. FIG. 3 depicts a simplified support structure in which the first conductive support structure 20 and the second conductive support structure 21 are formed by respective pillars, one on either side of the inertial mass element 22. Additional support pillars may be provided if required, e.g. if the inertial mass element 22 is suspended by more than two conductive connection portions 24.

Figure 4:
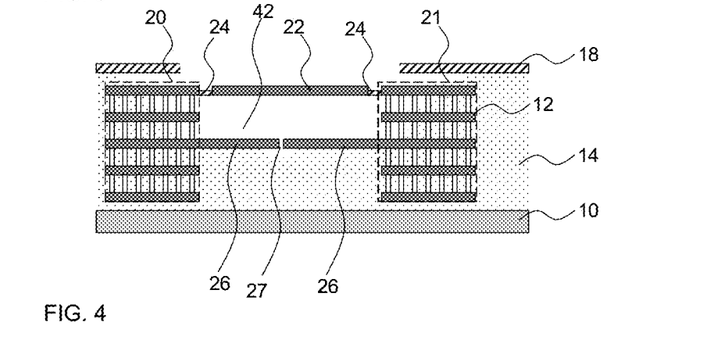
FIG. 4-7 schematically depict various further embodiments of an electronic device of the present invention.

In an embodiment as shown in FIG. 4, an additional etch barrier formed in a metal layer 12 below the inertial mass element 22 may be provided. The additional etch barrier in FIG. 4 is formed by two non-contacting metal portions 26, which extend from the first conductive support structure 20 to the second conductive support structure 21 and vice versa. A gap 27 separates the two metal portions 26 to ensure that these portions do not provide an additional conductive path parallel to the conductive path of the fuse-like shock sensor. By the provision of this additional etch barrier, the depth of the cavity 42 can be limited and the potential under etch of the entire support structures can be avoided, thus preventing the lift-off of the shock sensor.

In the above embodiments, the inertial mass element 22 is formed of a single metal layer 12 (which may comprise a stack of sub-layers as previously explained). As previously explained, since the force at which the conductive connection portions 24 fracture is correlated to the mass m of the inertial mass element 22, relatively large area metal portions may be required in case of limited thickness of the metal layer 12 from which the inertial mass element 22 is formed, which may increase the footprint of the electronic device.

Figure 5:
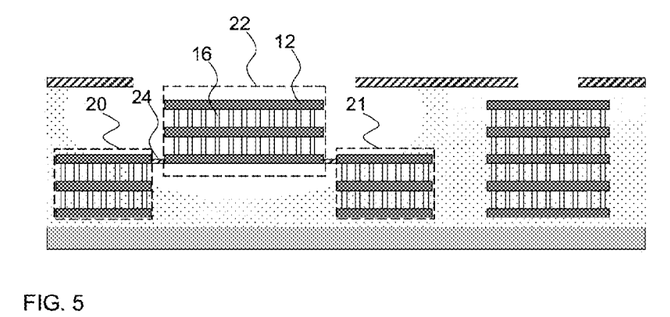

This may be overcome by the embodiment of the electronic device of the present invention as shown in FIG. 5, in which the inertial mass element 22 is formed by a plurality of metal layer portions 12 interconnected by vias 16 to increase the mass M of the inertial mass element 22. In FIG. 5, the inertial mass element 22 comprises three metal layers 12 interconnected by two via layers by way of non-limiting example only. Any suitable number of metal layers may be chosen.

Any metal layer of the inertial mass element 22 may be connected to the first conductive support structure 20 and the second conductive support structure 21 via the conductive connection portions 24. In FIG. 5, the bottom metal layer of the inertial mass element 22 is connected to the respective top metal layers of the first conductive support structure 20 and the second conductive support structure 21, in FIG. 6 the top metal layer of the inertial mass element 22 is connected to the respective top metal layers of the first conductive support structure 20 and the second conductive support structure 21 and in FIG. 7 an intermediate metal layer of the inertial mass element 22 is connected to respective intermediate metal layers of the first conductive support structure 20 and the second conductive support structure 21.

The first conductive support structure 20 and the second conductive support structure 21 may have the same heights or may have different heights, i.e. the same or different number of interconnected metal layers 12. The inertial mass element 22 may be connected to metal portions of the first conductive support structure 20 and the second conductive support structure 21 at the same metal layer level or at different metal layer levels. Each side of the inertial mass element 22 may be connected by more than conductive connection portion 24 to the corresponding support structure 20 or 21, and the respective conductive connection portions 24 may be connected to different metal layers 12 of the support structure 20 or 21.

Figure 6:
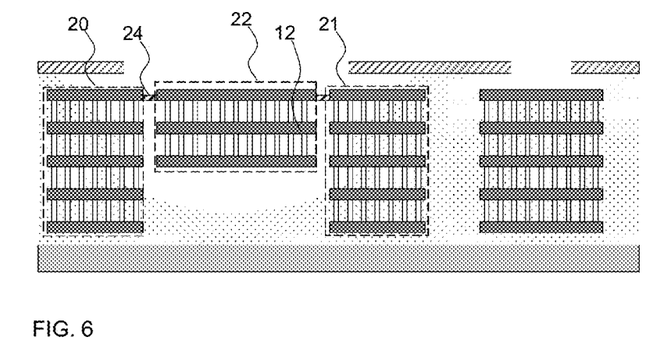
Figure 7:
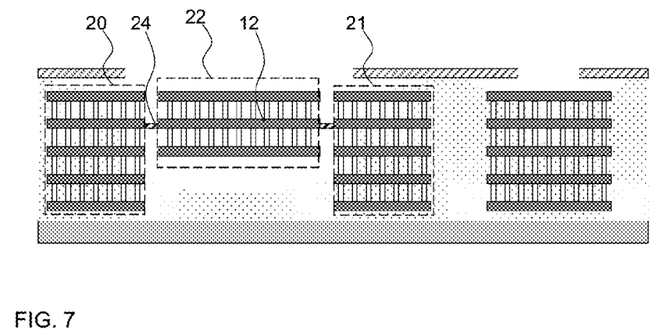

It should be recognized that the different embodiments of the electronic device as shown in FIG. 5-7 may be realized using conventional CMOS processing steps with the addition of the release etching step as explained in more detail in FIG. 1. Because both the metal layers 12 as well as the interconnect vias 16 between adjacent metal layers 12 contribute to the overall mass of the inertial mass element 22, it is preferable that the via density is as high as possible to minimize the required area of the inertial mass element 22. For instance, in a CMOS 14 technology using Al for the metal layers 12 and W vias 16, the mass of a via layer is as high as the mass of a metal layer 12 due to the high specific density of tungsten.

Figure 8:
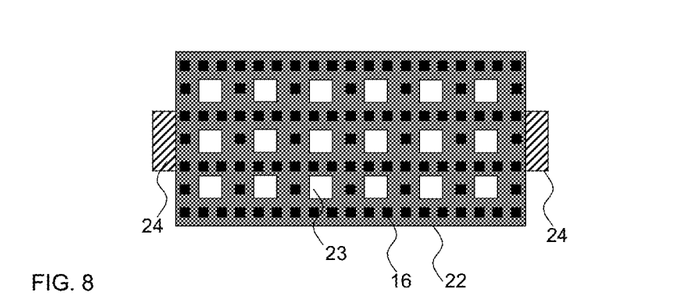
FIG. 8 schematically depicts an aspect of an electronic device in accordance with yet another embodiment of the present invention.

FIG. 8 shows a top view of a part of a shock sensor in accordance with the embodiments shown in FIG. 5-7, in which the inertial mass element 22 comprises the perforations 23 as well as the vias 16. The perforations 23 are vertically aligned in the various metal layers 12 of the inertial mass element to aid the formation of the cavity 42 in the release etching step as previously explained. The conductive connection portions 24 connect the inertial mass element 22 to the conductive support structures (not shown).

In the above embodiments, the conductive connection portions 24 are formed in one of the metal layers 12 of the metallization stack of the electronic device of the present invention. This, however may not always be suitable, for instance when the elastic deformability of the conductive connection portions 24 exceeds the gap size between the mass element 22 and the walls of the cavity 42. Upon acceleration of the inertial mass element 22, this elastic deformability will elongate the conductive connection portions 24, thereby allowing the inertial mass element 22 to contact the cavity walls. This may prevent the conductive connection portions 24 from fracturing or may cause the conductive connection portions 24 to fracture at acceleration values that deviate from the predefined critical acceleration such that the fuse-like shock sensor can produce inaccurate readings.

Figure 9:
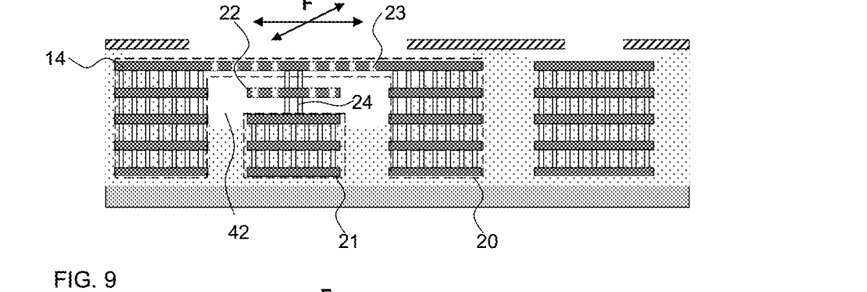
FIG. 9-12 schematically depict various further embodiments of an electronic device of the present invention.
Figure 10:
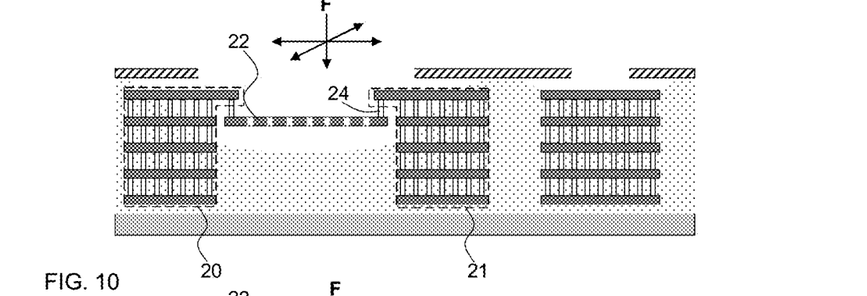
Figure 11:
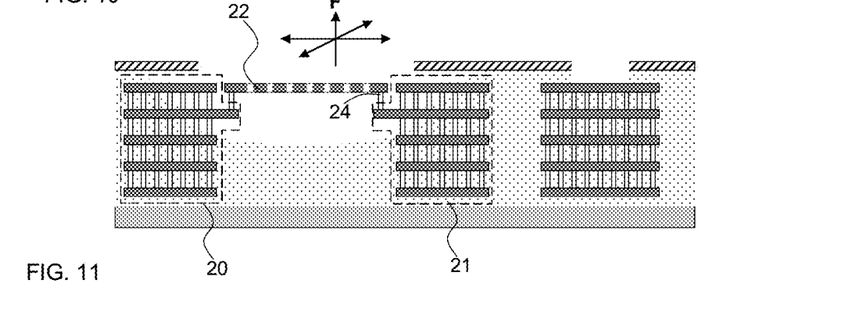

This may be prevented by using different, e.g. more brittle materials for the conductive connection portions 24, e.g. TiN, but this has the disadvantage that additional process steps may be required, which adds to the cost of the electronic device. In case of such small gap sizes, another embodiment of the shock sensor of the present invention as depicted in FIG. 9-11 may be used. In these embodiments, the conductive connection portions 24 are formed of vias such that the respective metal layers of first and second conductive support structures 20, 21 are vertically displaced with respect to the metal layer of the inertial mass element 22 to which they are connected via the conductive connection portions 24.

In FIG. 9, the first conductive support structure 20 has two conductive pillars surrounding the inertial mass element 22. The conductive support structure 20 further has a metal layer portion 12 that interconnects the aforementioned pillars, and which extends over the inertial mass element 22. The inertial mass element 22 is connected to this bridging metal portion 12 by a conductive connection portion 24 comprising a plurality of vias. The second conductive support structure 21 is located underneath the inertial mass element 22, with the inertial mass element 22 being connected to the top metal layer of the second conductive support structure 21 via a further plurality of vias such that the inertial mass element 22 is suspended (sandwiched) between the first and second conductive support structures 20, 21, with the conductive path for detecting the fracturing of the shock sensor being formed by the inertial mass element 22 and the vias connecting the inertial mass element 22 to these support structures.

It is emphasized that for any of the embodiments in FIG. 9-11, any suitable number of vias may connect the inertial mass element 22 to one of the conductive support structures. In FIG. 9, a plurality of vias is shown by way of non-limiting example only. It should further be understood that the critical acceleration force at which the sensor is released is defined by the number of vias; more vias per conductive connection structure 24 implies a higher critical acceleration force, via geometry, e.g. length and cross section area, the mass of the inertial mass element 22, with a higher mass translating into a smaller critical acceleration force and the adhesion force of the interface between the via(s) of the conductive connection portions 24 and the metal layer of the inertial mass element 22. Also, it is pointed out that the embodiments shown in FIG. 9-11 may be realized using the manufacturing method depicted in FIG. 1, such that these embodiments may be realized in existing processing technologies without modification of the processing steps apart from the formation of the cavity 42 as previously explained.

By connecting the shock sensor of electronic device of the present invention to its support frame using vias, an additional advantage is that the sensor can be made sensitive to acceleration forces having different directional components by design. For instance, the shock sensor of FIG. 9, in which the inertial mass element 22 is vertically sandwiched between the first conductive support structure 20 and the second conductive support structure 21 is sensitive to in-plane acceleration forces as indicated by the force vectors (arrows) labeled 'F' in FIG. 9.

In FIG. 10, the inertial mass element 22 is suspended (dangling) from the first conductive support structure 20 and the second conductive support structure 21 such that the shock sensor is sensitive to in-plane acceleration forced as well as an acceleration in a downward vertical direction, i.e. towards the plane of the substrate 10, as indicated by the arrows 'F'.

In FIG. 11, the inertial mass element 22 is resting on the first conductive support structure 20 and the second conductive support structure 21 such that the shock sensor is sensitive to in-plane acceleration forced as well as an acceleration in a upward vertical direction, i.e. away from the plane of the substrate 10, as indicated by the arrows 'F'. In the embodiments shown in FIGS. 10 and 11, the conductive support structures 20, 21 each comprise at least one metal layer that laterally protrudes into the cavity 42 such that the inertial mass element 22 may be suspended from these protruding metal layers.

It will be clear to the skilled person that depending on the number and arrangement of vias comprised in the conductive connection portions 24, as well as on the overall sensor geometry and rupture characteristics of the interface, the critical acceleration values at which the inertial mass element 22 is released may vary for different directions. In case this is unwanted, care has to be taken in the sensor design stage to ensure that the same release value for all three directions in space is achieved.

In the thus far described embodiments of the electronic device of the present invention, opposite ends of the inertial mass element 22 are typically connected to the conductive support structures 20, 21. This however is not essential for the present invention, as is demonstrated in FIG. 12 in which the inertial mass element 22 is connected to the first conductive support structure 20 and the second conductive support structure 21 by respective vias at the same end portion of the inertial mass element 22 such that the inertial mass element 22 acts as a lever. The inertial mass element 22 is shown to have perforations to aid the formation of the cavity 42 as previously explained by way of non-limiting example.

Figure 12:
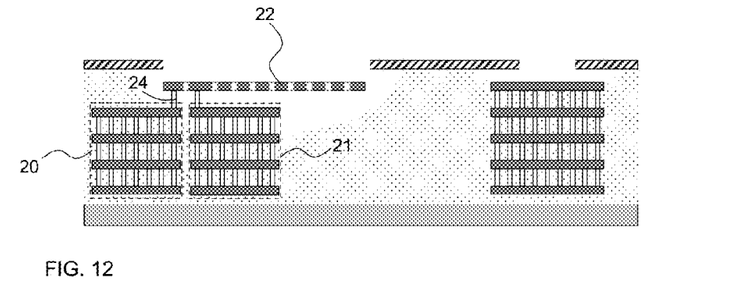

Upon exposure of the inertial mass element 22 to an acceleration force, the lever design amplifies the forces exerted on the conductive connection portions 24, e.g. vias. This has the advantage that for the inertial mass element 22 to release from its support structures 20, 21, a smaller mass per unit force is required. In other words, the lever design allows for a reduced size inertial mass element 22, thereby reducing the overall size and cost of the electronic device of the present invention.

Figure 13:
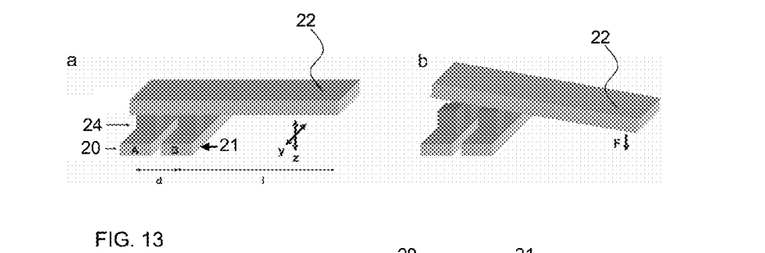
FIGS. 13 and 14 schematically depict the operation principle of respective parts of yet further embodiments of the electronic device of the present invention.

Although the theory of how levers work is well-known, the lever principle is briefly discussed in FIG. 13, in which the total length of the inertial mass element 22 is defined by l+d, with l being the lever length and d being the distance between the centers of the support structures 20, 21. For l>>d, the leverage ratio may be approximated by l/2d, with lever ratios of 100 and more being readily achievable in most semiconductor technologies such as CMOS. For instance, in existing CMOS 14 technologies, the minimum distance between the centers of the first conductive support structure 20 and the second conductive support structure 21 is 0.512 micron, which requires a length l of 102.4 micron to achieve a lever ratio of 100.

Figure 14:
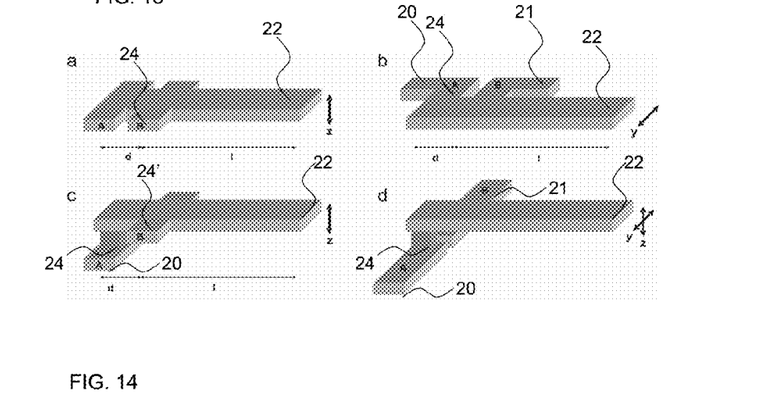

As indicated in the pane of FIG. 13 labeled 'a', forces in the y and z direction exceeding the critical acceleration force will cause a release of the inertial mass element 22 as shown in pane 'b' for a force in the z-direction. The lever-based embodiment of the present invention is not limited to the arrangement shown in FIGS. 12 and 13 where the inertial mass element 22 is mounted on the conductive support structures 20, 21 using vias. Exemplary alternative embodiments are schematically depicted in FIG. 14.

In pane a, opposite sides of the metal layer of the inertial mass element 22 are connected to respective metal layers of the conductive support structures 20, 21 (not shown) from the same metal layer of the metallization stack by conductive connection portions 24 from this same metal layer, such that the lever is released upon being exposed to forces exceeding the critical acceleration in the z-direction (i.e. the vertical direction).

In pane b, the same side of the metal layer of the inertial mass element 22 is connected to respective metal layers of the conductive support structures 20, 21 from the same metal layer of the metallization stack by conductive connection portions 24 from this same metal layer, such that the lever is released upon being exposed to forces exceeding the critical acceleration in the y-direction (i.e. a horizontal direction perpendicular to the length l of the lever).

In pane c, an inertial mass element 22 being connected to the conductive support structures 20, 21 through a combination of a via-based conductive connection portion 24 and a metal layer portion-based conductive connection portion 24' is shown. In this embodiment, the lever is released upon being exposed to forces exceeding the critical acceleration in the z-direction.

In pane d, an alternative to the embodiment shown in FIG. 12 is depicted. In this alternative embodiment, the conductive support structures 20, 21 are arranged in a row (e.g. running from front to back) with a small gap in between the two structures. Vias 16 are placed in a single line on top of the support structures 20, 21 thereby minimizing d (given by fixed VIA diameter) and maximize overall leverage ratio for a given lever length l. The lever-based shock sensor in pane d is released upon being exposed to forces exceeding the critical acceleration in the z-direction as well as in the y-direction.

The embodiments shown in FIG. 14 are shown by way of non-limiting example only. Other arrangements, e.g. in which the inertial mass element 22 hangs suspended from at least one of the conductive support structures 20, 21 are equally feasible. It is further pointed out that different embodiments of the present invention may be advantageously combined. For instance, the embodiments shown in FIG. 5-14 may be combined with the etch stop formed by the metal portions 26 as shown in FIG. 4, and so on.

The electronic device of the present invention may further comprise a plurality of the above described fuse-like shock sensors, which may have been designed to fracture at different critical acceleration forces to allow accurate determination of the force of the impact to which the electronic device has been exposed. The plurality of fuse-like shock sensors may comprise sensors according to the same embodiment of the present invention in which the dimensions of the inertial mass element 22 and the conductive connection portions 24 have been varied, as well as one or more sensors of different embodiments of the present invention.

Figure 15:
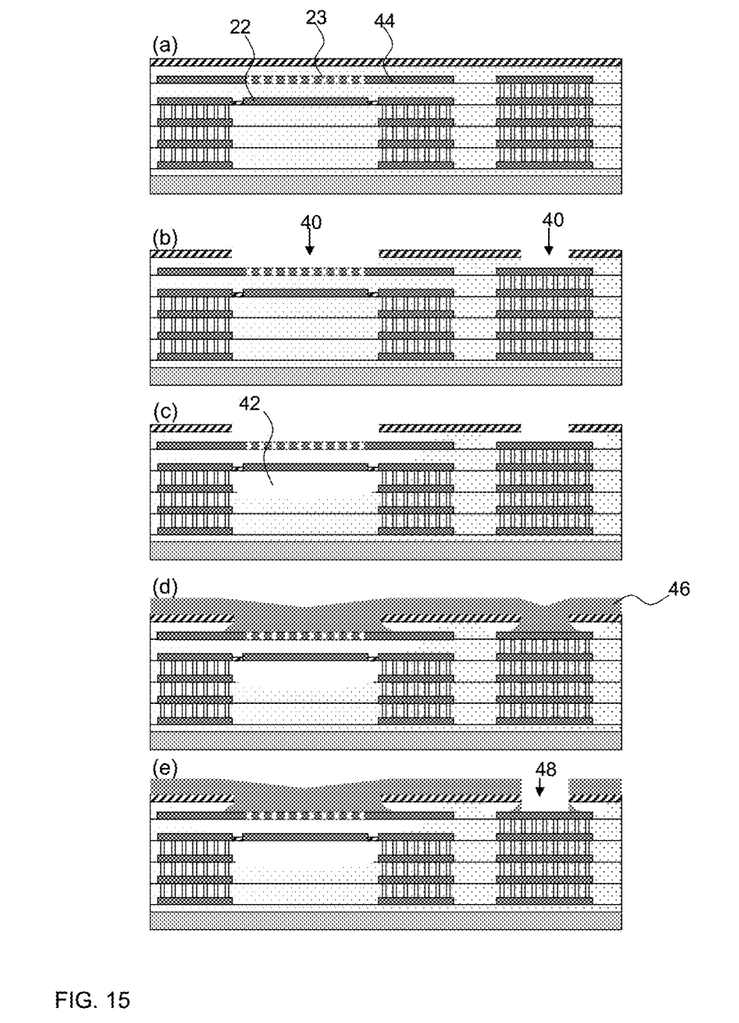
FIG. 15 schematically depicts another example embodiment of the method of the present invention.

FIG. 15 shows another embodiment of a method of manufacturing an electronic device of the present invention, in which a top metal layer portion 44 is provided over the cavity 42 to be formed. The top metal portion 44 comprises perforations 23 to facilitate the packaging of the electronic device by sealing the cavity 42 with a capping layer following its formation.

A known way of controlling the contamination of an etched cavity in a capping process is by patterning the passivation stack over the area to be etched, thereby forming a plurality of (equidistant) openings, i.e. release holes, in the passivation stack to provide limited access to the area to be etched. Such release holes must be kept small enough to avoid that upon re-sealing the electronic device, sealant enters the etched cavity 42, because this can leave the shock sensor unreliable or even inoperable. Typically, release holes having a diameter of 1 micron or less are acceptable if the capping layer deposition process is highly non-conformal, e.g. a sputter process. However, such hole sizes may not be easily achievable in a passivation layer without the inclusion of additional process steps such as an additional etching step. The etching step for opening the bond pads is unsuitable for defining such perforations because this step typically creates openings that are an order of a magnitude larger.

For this reason, in step (a), the metallization stack of the electronic device further comprises a top metal layer portion 44 over the cavity to be formed in which perforations 23 have been provided. Such perforations may be defined in the etch step of this metal portion, such that no additional processing steps are required. The top metal layer portion 44, which at least partially extends over the conductive support structures 20, 21, acts as a capping structure for the cavity to be formed. As previously explained, the top metal layer portion 44 may be a stacked layer structure comprising a plurality of stacked sub-layers. Preferably, no perforations 23 are provided in the parts of the top metal layer portion 44 directly over the conductive connection portions 24 because any contamination of the conductive connection portions 24 portions by the sealant, i.e. the capping material 46, could alter the critical acceleration at which the inertial mass element 22 is released.

Upon exposing the top metal layer portion 44 (and the other structures such as bond pad 30) by removing selective portions of the passivation stack, thereby forming openings 40 as shown in step (b), the perforations in the top metal layer portion 44 act as the release holes for the release etching step in which the cavity 42 is formed, as shown in step (c). Next, in step (d), the openings 40 are sealed again using any suitable capping layer 46, e.g. a SiN, SiO$_2$ or metal layer, after which in step (e) the bond pads 30 are exposed again by selective removal of the capping layer 46 in any suitable manner, thus creating opening 48. Alternatively, only the shock sensor area is opened in step (b), in which case the bond pads are only opened during step (e). It will be appreciated that this embodiment is particularly suitable for packaging the electronic device containing the shock sensor of the present invention.

In summary, an electronic device comprising an embodiment of the shock sensor of the present invention is capable of detecting misuse of the electronic device without requiring continuous monitoring of the electronic device. The electronic device be a single chip or may comprise multiple components mounted on a carrier such as a multi-chip module, system-in-package or printed circuit board, in which at least one of the components may comprise the shock sensor of the present invention. This shock sensor is capable of monitoring the misuse of the electronic device as a whole. Non-limiting examples of an electronic device of the present invention include wireless communication devices such as mobile phones and personal digital assistants, portable computers such as laptops or notebooks, consumer electronics devices such as digital cameras, MP3 players, digital radios and so on. The present invention may be applied to any electronic device that can be damaged by excessive impacts or mechanical shocks.

It should be noted that the above-mentioned embodiments illustrate rather than limit the invention, and that those skilled in the art will be able to design many alternative embodiments without departing from the scope of the appended claims. In the claims, any reference signs placed between parentheses shall not be construed as limiting the claim. The word "comprising" does not exclude the presence of elements or steps other than those listed in a claim. The word "a" or "an" preceding an element does not exclude the presence of a plurality of such elements. The invention can be implemented by means of hardware comprising several distinct elements. In the device claim enumerating several means, several of these means can be embodied by one and the same item of hardware. The mere fact that certain measures are recited in mutually different dependent claims does not indicate that a combination of these measures cannot be used to advantage.

The invention claimed is:

1. A semiconductor device comprising:
    a stack of patterned metal layers separated by dielectric layers, the dielectric layers having a first plurality of conductive vias that connect metal layers adjacent to the dielectric layers, the stack comprising:
        a first conductive support structure having a first metal layer and a second conductive support structure having a second metal layer;
        a cavity between the first conductive support structure and the second conductive support structure;
        an inertial mass element having at least one metal portion which is vertically displaced with respect to the first metal layer and the second metal layer; and
        a first plurality of conductive connection vias that conductively couple the inertial mass element to the first metal layer and the second metal layer, wherein at least one of the first plurality of conductive connection vias is configured to break upon the inertial mass element being exposed to an acceleration force exceeding a threshold defined by dimensions of the first plurality of conductive connection vias.

2. The semiconductor device of claim 1, further comprising:
    a detector configured to detect a disruption in the conductive coupling of the inertial mass element to the first metal layer and the second metal layer.

3. The semiconductor device of claim 1, wherein the inertial mass element is below the first metal layer and the second metal layer.

4. The semiconductor device of claim 1, wherein the inertial mass element is above the first metal layer and the second metal layer.

5. The semiconductor device of claim 4, wherein the first plurality of vias connect the inertial mass element to the first metal layer and the second metal layer near a first lateral end of the inertial mass element and a first force applied to a second lateral end of the inertial mass element applies a second force to one of the first plurality of vias in a substantially opposite direction of the applied first force.

6. The semiconductor device of claim 1, wherein the inertial mass element is between the first metal layer and the second metal layer.

7. The semiconductor device of claim 1, wherein the inertial mass element has a plurality of perforations extending through the inertial mass element.

8. The semiconductor device of claim 1, wherein the inertial mass element comprises a stack of metal layer portions separated by dielectric layer portions and each of the dielectric layer portions comprises a second plurality of vias configured to conductively interconnect the stack of metal layer portions.

9. The semiconductor device of claim 1, wherein the stack comprises a plurality of cavities each comprising a respective inertial mass element conductively coupled to the first metal layer and the second metal layer by the first plurality of vias and at least one of the first plurality of vias associated respectively with each cavity is configured to break upon the respective inertial mass element being exposed to an acceleration force exceeding a threshold that is unique to that respective cavity.

10. A method of manufacturing a semiconductor device, comprising:
   forming a stack of patterned metal layers separated by dielectric layers, the stack comprising a first conductive support structure having a first metal layer, a second conductive support structure having a second metal layer, and an inertial mass element comprising at least one metal portion and a first plurality of conductive connection vias that conductively couple the inertial mass element to the first metal layer and the second metal layer, wherein at least one of the first plurality of conductive connection vias is configured to break upon the inertial mass element being exposed to an acceleration force exceeding a threshold defined by dimensions of the first plurality of conductive connection vias;
   forming a passivation layer over the stack;
   selectively removing the passivation layer over an area comprising the inertial mass element to form an exposed area; and
   etching the exposed area to form a cavity around the inertial mass element.

11. The method of claim 10, wherein the stack comprises a perforated metal portion extending over the inertial mass element and at least partially extending over the first conductive support structure and the second conductive support structure and the etching step is performed through perforations of the perforated metal portion.

* * * * *